United States Patent

Irvin

[15] 3,655,540

[45] Apr. 11, 1972

[54] METHOD OF MAKING SEMICONDUCTOR DEVICE COMPONENTS

[72] Inventor: John Calhoun Irvin, Berkeley Heights, N.J.

[73] Assignee: Bell Telephone Laboratories, Incorporated, Murray Hill, N.J.

[22] Filed: June 22, 1970

[21] Appl. No.: 48,315

[52] U.S. Cl. .....................................204/143 GE, 204/143 R

[51] Int. Cl.......................................................B23p 1/00

[58] Field of Search...................204/143 GE, 143 R; 29/576, 29/578; 148/1.5

[56] References Cited

UNITED STATES PATENTS 2,656,496 10/1953 Sparks.............................204/143 GE 3,096,262 7/1963 Shockley.........................204/143 GE 3,536,600 10/1970 Van Disk et al....................204/143 R 3,550,260 12/1970 Saltich et al.............................29/576

*Primary Examiner*—John H. Mack

*Assistant Examiner*—Neil A. Kaplan

*Attorney*—R. J. Guenther and Arthur J. Torsiglieri

[57] ABSTRACT

Extremely thin semiconductor wafers are formed by growing an N-conductivity epitaxial layer on an $N^+$-type substrate. A Schottky barrier contact is formed on the epitaxial layer and the assembly is immersed in an appropriate fluid for electrolytic etching. Because of differential etch rates as a function of conductivity, and with an appropriate contact voltage, the substrate is selectively dissolved, leaving only the thin epitaxial layer adhered to the contact. The contact is then removed, leaving the epitaxial layer as an independent ultrathin wafer.

6 Claims, 2 Drawing Figures

PATENTED APR 11 1972 3,655,540

INVENTOR
J. C. IRVIN
BY
Robert B. Anderson
ATTORNEY

METHOD OF MAKING SEMICONDUCTOR DEVICE COMPONENTS

BACKGROUND OF THE INVENTION

This invention relates to the fabrication of semiconductor devices, and more particularly, to the formation of ultrathin semiconductor wafers.

Improved negative resistance diodes known as IMPATT diodes, which are capable of generating electromagnetic waves at microwave frequencies, are described in the paper "The IMPATT Diode — A Solid State Microwave Generator," by K. D. Smith, *Bell Laboratories Record*, Vol. 45, May 1967, page 144; the paper "Microwave Si Avalanche Diode with Nearly Abrupt Type Junction," by T. Misawa, *IEEE Transactions on Electron Devices*, Vol. ED–14, Sept. 1967, page 580; and the patent of B. C. DeLoach, Jr., et al., U.S. Pat. No. 3,270,293. Diodes of this type attain a negative resistance through an appropriate phase difference between external terminal voltages and current pulses traveling across a transit region of the device. As the frequency of operation becomes progressively higher, the thickness of the active region of a device must become progressively smaller and, if the diode is made on a conventional silicon wafer, the major part of the diode may consist of an inactive substrate portion which constitutes a series electrical resistance. It would therefore be desirable to form the diode on a very thin semiconductor wafer substrate. Because of the susceptibility of silicon to cracking, however, wafers as thin as would be desired cannot be made by the conventional method of slicing the wafer from a silicon cylinder and then polishing it to a thinner size.

One possible method that has been considered for making ultrathin wafers is to grow a relatively low conductivity (N-type) epitaxial layer on a relatively high conductivity ($N^+$-type) silicon substrate. A contact is made to the periphery of the $N^+$ substrate, and the substrate is dissolved by electrolytic etching. Because the electrolytic etch rate of high conductivity silicon is much greater at certain voltages than that of low conductivity silicon, the etch rate abruptly drops after the substrate has been dissolved and the assembly can be removed with the epitaxial layer substantially intact. This, of course, leaves the desired thin silicon wafer from which high frequency IMPATT diodes can be fabricated.

Unfortunately, this technique has been found to yield thin wafers of non-uniform thickness. Because of the tendency of the portion of the $N^+$-type substrate adjacent to the contact to be etched or dissolved to a greater extent than other parts, the substrate is not etched away uniformly. The substrate and epitaxial layer also may be dissolved near the contact while other portions of the substrate remain undissolved.

SUMMARY OF THE INVENTION

It is an object of this invention to provide ultrathin semiconductor wafers.

It is theorized that many of the problems mentioned above could be avoided if ultrathin wafers of substantially uniform thickness could be formed. Accordingly, it is another object of this invention to form, by electrolytic etching, ultrathin semiconductor wafers of substantially uniform thickness.

These and other objects of the invention are achieved in a process of the type described in the foregoing Abstract of the Disclosure. I have found that, by forming a continuous Schottky barrier contact over the entire surface of the epitaxial layer, uniform etching of the semiconductor will be assured, with a resultant finished ultrathin wafer of substantially uniform thickness.

These and other objects, features, and advantages of the invention will be better understood from a consideration of the following detailed description taken in conjunction with the accompanying drawing.

DRAWING DESCRIPTION

FIG. 1 is a schematic illustration of apparatus for forming an ultrathin semiconductor wafer in accordance with an illustrative embodiment of the invention; and FIG. 2 is a graph of silicon etch rate as a function of voltage in the apparatus of FIG. 1.

DETAILED DESCRIPTION

Figure 1:
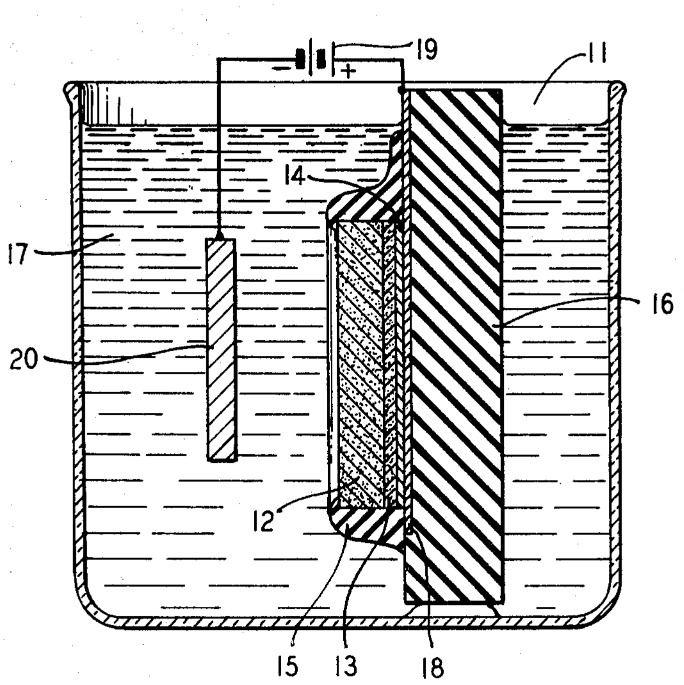

Referring to the drawing, FIG. 1 shows an assembly 11 used in the formation of an ultrathin semiconductor wafer in accordance with my process. The assembly includes an $n^+$-type silicon substrate 12 having an N-type epitaxial layer 13 upon which a Schottky barrier contact 14 has been formed. These components are mounted by a wax layer 15 on an insulating support 16 which is immersed in an electrolyte 17. A battery 19 produces a voltage between the Schottky barrier contact 14 and an electrode 20 within the electrolyte to dissolve by electrolytic etching the substrate 12. The purpose of this process is to selectively dissolve the substrate 12 while leaving the epitaxial layer 13 intact as the ultrathin semiconductor wafer.

The first step in my process is to epitaxially grow the thin layer 13 on the substrate 12. The substrate 12 is a conventional slice of $N^+$ conductivity silicon which is cut from a silicon cylinder in a conventional manner. Epitaxial growth refers to a process of forming a thin film or layer such that it effectively constitutes an extension of the crystal lattice structure of the substrate. Uniform epitaxial layers having a thickness on the order of 1 micron can be routinely formed in a manner well known in the art.

Next, the Schottky barrier contact 14 is formed on the exposed surface of epitaxial layer 13. A good contact can be made by evaporating a metal, typically gold, onto the epitaxial surface. Alternatively, the epitaxial surface may be covered with a conductive adhesive such as silver paste and then pressed firmly against either a sheet of gold foil or a conductive layer on the support member 16. With a properly flat semiconductor-metal interface, the resulting contact will be substantially continuous over substantially the entire epitaxial surface. In any case, the contact must form a good Schottky barrier; that is, there must be a sharp conductivity discontinuity at the interface and good rectification characteristics. The Schottky barrier is required to prevent the injection of minority carriers into the epitaxial layer during the electrolytic etching of the substrate.

The assembly 11 is then completed by mounting the substrate onto the supporting member 16 by the wax layer 15, which also masks the periphery of the substrate during etching. The assembly is immersed in the electrolyte 17 which is preferably a 5 percent hydrofluoric acid solution. The voltage between electrode 20 and contact 14, applied by battery 19, is then selected to give a much higher etch rate to the substrate 12 than to the epitaxial layer 13.

Figure 2:
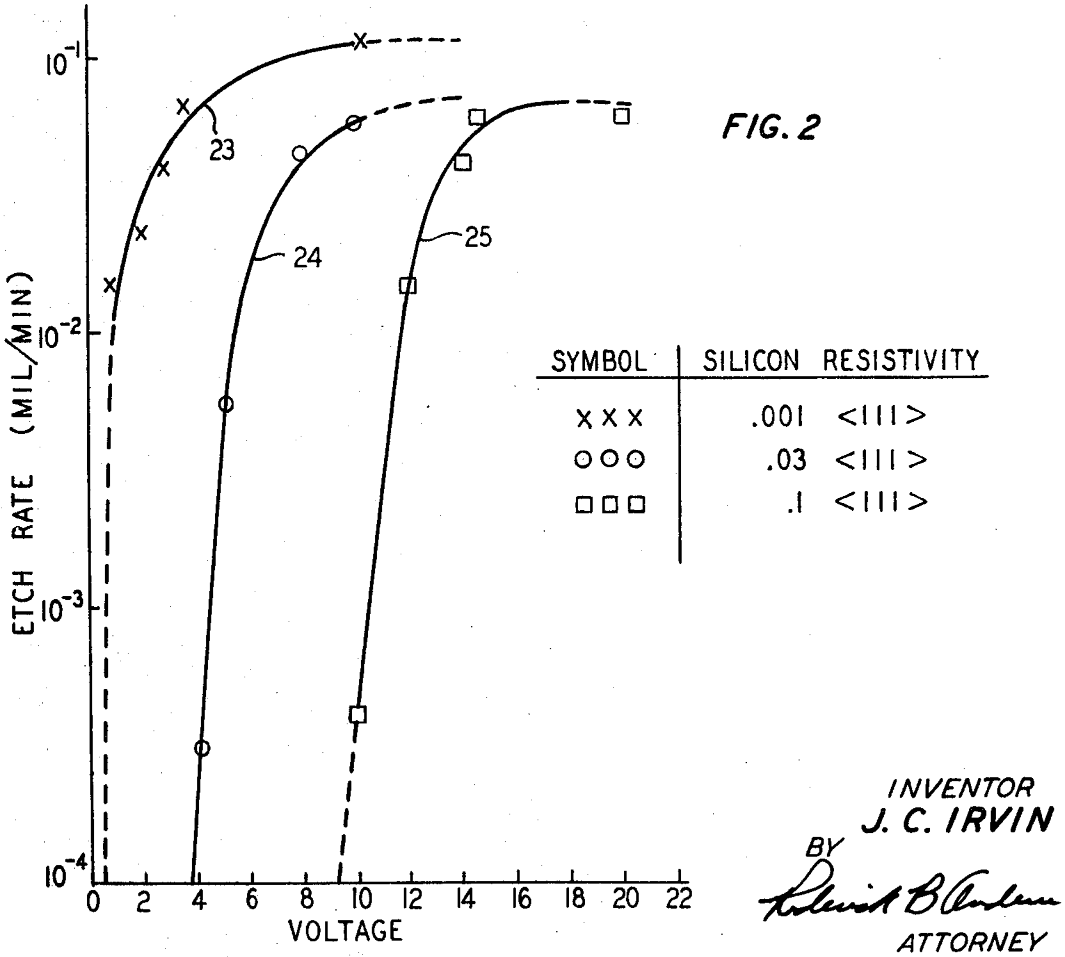

Referring to FIG. 2, there is shown a graph of etch rate versus voltage of silicon in the apparatus of FIG. 1. Curves 23, 24, and 25 indicate the etch rates of silicon having respective resistivities of 0.001 ohm-centimeters, 0.03 ohm-centimeters and 0.1 ohm-centimeters. These curves demonstrate that it is possible to choose the relevant resistivities and applied voltages such that the etch rate of the substrate is more than an order of magnitude higher than that of the epitaxial layer 13. For example, if the substrate has a resistivity of 0.03 ohm-centimeters, corresponding to curve 24, and if the epitaxial layer has a resistivity of 0.1 ohm-centimeters, corresponding to curve 25, and if the applied voltage is 8 volts, then the etch rate of the substrate will be relatively high, while that of the epitaxial layer is extremely low. Upon application of the voltage, the substrate 12 is therefore dissolved by the well-known mechanism of electrolytic etching. After the substrate has been completely dissolved, the assembly can be removed from the electrolyte before any significant etching of the epitaxial layer takes place because of the extremely low etch rate of the epitaxial layer. The metal layer 14 may thereafter be removed, as by selective etching, or it may remain adhered to the ultrathin wafer for subsequent use as an electrode of the semiconductor devices made from the wafer.

The differential etch rates illustrated in FIG. 2 are predicated on the assumption of majority carrier (electron) current through the semiconductor during etching. With regard to minority carriers, or hole current, the etch rates of the two semiconductors are substantially similar, rather than being radically different as required in the process. It is therefore important that the contact 14 be a Schottky barrier contact to preclude the injection of minority carriers into the semiconductor during operation. Also, it is recommended that the etching be done in the dark to avoid the undesired photon generation of holes in the semiconductor.

Ultrathin wafers having a thickness of 8 microns and a diameter of 0.8 inch have successfully been made using the above-described technique. Uniform thicknesses of 1 micron have been achieved when 50 mil diameter windows were etched into the substrate. It is, of course, difficult to make large diameter wafers with thicknesses as low as 1 micron. A coating of KTFR photoresist material may be used as a mask to form the windows needed when producing wafer films of less than about 8 microns thickness.

While stirring of the electrolyte is helpful, in accordance with conventional practice, it is important not to stir it too vigorously to avoid stressing the thin film wafer. A DC milliammeter can be conveniently included in the electrical circuit for monitoring the etching current to ascertain when the desired thickness has been obtained. When the substrate has been completely dissolved, the etching current drops and the assembly may be removed.

The foregoing is, of course, intended only to be illustrative of the inventive concepts involved. Numerous other embodiments and modifications may be made by those skilled in the art without departing from the spirit and scope of the invention.

What is claimed is:

1. A process of making ultrathin semiconductor wafers comprising the steps of:

forming a thin semiconductor layer on a semiconductor substrate, the layer having a significantly higher resistivity than the substrate;

forming a substantially continuous Schottky barrier contact over substantially the entire exposed surface of the layer;

sealing the periphery of the substrate so that the layer is unexposed and only one surface of the substrate is exposed;

immersing the assembly in an electrolyte, the substrate and the layer each being characterized, with respect to the electrolyte, by an etch rate which is a function of applied voltage;

applying to the Schottky barrier contact a voltage, with respect to an adjacent electrode, that imparts to the substrate a relatively high etch rate, but which imparts to the layer a significantly lower etch rate, whereby the substrate selectively dissolves; and removing the assembly after the substrate has been dissolved and before the layer has been significantly etched, thereby to form a thin layer of said wafer.

2. The method of claim 1 wherein:

the wafer is silicon and the step of forming a thin layer comprises the step of epitaxially growing a thin layer of silicon having a significantly higher resistivity than the substrate.

3. The method of claim 2 wherein:

the step of forming a Schottky barrier contact on the layer comprises the step of evaporating metal onto the layer; and further comprising the step of removing the contact comprising the step of selectively etching the metal from the layer.

4. The method of claim 2 wherein:

the step of forming a Schottky barrier contact comprises the step of coating the layer with a conductive adhesive; and forcing a flat metal contact against the adhesive under pressure.

5. The method of claim 2 wherein:

the electrolyte is hydrofluoric acid; and the step of sealing the periphery comprises the step of covering the periphery of the substrate with wax.

6. The method of claim 2 wherein the semiconductor layer and the semiconductor substrate are of N-type conductivity; and the step of applying a voltage comprises the step of forward-biasing the Schottky barrier contact.

* * * * *